United States Patent [19]

Schuerba

[11] 4,005,393
[45] Jan. 25, 1977

[54] BIPOLAR SEMICONDUCTOR MEMORY WITH RECHARGING CIRCUIT FOR CAPACITIVELY LOADED LINES

[75] Inventor: Reinhard Schuerba, Munich, Germany

[73] Assignee: Siemens Aktiengesellschaft, Berlin & Munich, Germany

[22] Filed: June 4, 1975

[21] Appl. No.: 583,690

[30] Foreign Application Priority Data

June 26, 1974 Germany .......................... 2430784

[52] U.S. Cl. ...................... 340/173 FF; 340/173 R
[51] Int. Cl.[2] ................... G11B 11/40; G11C 7/00
[58] Field of Search ... 340/173 R, 173 CA, 173 FF; 307/238

[56] References Cited

UNITED STATES PATENTS 3,546,682   12/1970   Cagnac et al. ............... 340/173 FF
3,786,442   1/1974    Alexander et al. ......... 340/173 CA

OTHER PUBLICATIONS

IBM Tech. Dis. Bull., vol. 10, No. 7, Dec. 1967, p. 1052, Andersen et al., "Circuit for Forced Recovery of Capacitive Memory Word Lines".

Primary Examiner—Thomas A. Robinson
Attorney, Agent, or Firm—Hill, Gross, Simpson, Van Santen, Steadman, Chiara & Simpson

[57] ABSTRACT

A bipolar semiconductor memory has a matrix of word-by-word selectable memory cells and selective circuits associated therewith in the word direction and in the bit direction for selective memory words in response to receipt of address signals. A decoder includes output switches which are in the form of emitter followers which are connected to respective word lines. The memory cells present capacitive loads to the lines and a recharging circuit is connected to each word line of the matrix and includes a common constant current source which is connected to each word line by way of a respective coupling element. Each of the coupling elements are embodied as base-emitter paths of recharge transistors which have the respective collectors connected directly to a respective word line. A base resistance is also connected between the respective word line and the bae of a recharge transistor.

2 Claims, 3 Drawing Figures

BIPOLAR SEMICONDUCTOR MEMORY WITH RECHARGING CIRCUIT FOR CAPACITIVELY LOADED LINES

BACKGROUND OF THE INVENTION

1. Field of the Invention

This invention relates to a bipolar semiconductor memory which is word organized and includes a plurality of memory cells arranged in a matrix and selective circuits associated therewith in the word or bit direction, respectively, for selecting memory words in response to receipt of address signals, and more particularly to such apparatus in which, primarily in the selective circuit, each line of the memory matrix is connected to a line decoder at an output switch thereof which is embodied as an emitter follower for word selection.

2. Description of the Prior Art

Integrated semiconductor memories are utilized in a multitude of forms in modern data processing systems. For example they may be constructed as write-read memories having selective access, e.g. random access memory (RAM) in which the information content can be changed by way of the program, or as fixed value memories, e.g. read only memory (ROM) wherein the memory content cannot be changed once the same has been stored, but which will always be requested in the same manner again. In the case of fixed value memories constructed upon a semiconductor base, one differentiates more accurately between the common fixed value memories in which the information content is fixed during production at the manufacturing facility, e.g. fabricated read only memory (FROM) and the so-called programmable fixed value memory, e.g. programmable read only memory (PROM), in which the one who utilizes the memory can program the memory information content in the desired manner in accordance with his own requirements in a single process.

Although these memory types differ from one another, for example even in the embodiment of the memory cell, they have a common basic construction, as is well known in the art. For example, a bipolar memory comprises individual memory components wherein a multitude of memory cells is arranged in the form of a matrix. The memory cells are selectable by way of coincidently triggered word and bit lines. In the case of integrated memory component parts with internal control, the entire electronic system required for the operation of the memory cells is also contained upon the component member. In addition to a buffer for the component selection (chip select) a word decoder and at least one bit decoder are respectively provided, with the help of which an individual memory cell, in the case of bit-organized memories, or, in the case of word-organized memories, respectively, several memory cells, can be selected in one line. The "1-out-of-$n$" selection of the word line or column lines, respectively, by way of the corresponding decoders is effected in response to address signals which are intermediately stored row-by-row or column-by-column, respectively, in the decoders. Furthermore, a reading circuit is connected with the memory matrix, which reading circuit is connected to a data output buffer and which comprises a number of preamplifiers corresponding to the bits per memory word.

In the case of write-read memories, each component will, in addition, comprise a data input buffer and a write circuit connected therewith which is associated column-by-column with the memory matrix. The write circuit includes driver stages for writing information into the component. In the case of fixed value memories, this electronic unit for writing is omitted; only programmable fixed-value memories will obtain so-called charge networks in place of the writing unit, which networks are triggerable by way of address signals. These charge networks enable a user to adjust a certain information state in an electronic manner by way of the address signals of each memory cell. This happens, for example, in such a way that certain metallic line connections are melted, and thus separated, in all memory cells which are to have one of the two possible information states, for example a logical "1" stored therein, which happens with the help of the charge network. This is a one-time process and is not reversible.

Within the framework of this basic prior art construction of bipolar semiconductor memories, a multitude of variations in technical realization, as might be imagined, are well known in the art. The present invention, however, only relates to bipolar semiconductor memories of the above-mentioned different memory forms which use emitter followers as output switches in their selection circuits, e.g. techniques which are based, for example, upon the so-called emitter-coupled logic as a circuit technique (ECL technique). This circuit technique which, as is well known, is very fast, is relatively expensive and time consuming to produce, but is already used in semiconductor memories in which a very short access time is to be obtained. This is primarily true for fast auxiliary memories in central processing units, such as intermediate memories and micro-program memories in which the access time essentially influences the efficiency of a central processing unit of a data processing system. Emitter followers as output switches in selection circuits, however, are also possible in other circuit techniques; the ECL technique is thus only mentioned here as a typical example for a circuit technique wherein emitter followers are applied in multiple.

Emitter followers as output switches of selection circuits are already known for read-write memories having an average integration degree, for example with memory components of 256 bit memory capacity. Together with other circuit measures, the emitter followers permit a short access time in the prior art memory components. The further development of the prior art memory components to obtain a higher degree of integration, for example a memory component with 1024 bit memory capacity, however, is rendered difficult by these switches, unless unproportionally high access times are complied with, measured in relation to the prior art memory components of an average degree of integration.

This apparent paradox can be explained as follows:

Each emitter follower in a line decoder has its emitter respectively connected to one of the bit lines or word lines of the memory matrix, on the one hand, and to the collector of the transistor forming a constant current source, respectively, together with an emitter resistor. In the case of the "1-out-of $n$" selection in the decoder, one of its outputs, respectively, i.e. one of the emitter followers, will be selected. The respective emitter is then at a high potential ("high" level). All memory cells connected to one word line, however, have switch capacitances which add up and which cause a noticeable capacitive load at a line in the case of a higher degree of integration of the memory component. This means that capacitances must be recharged in the case of each state change of selected emitter followers, the amount of charge increasing with a growing degree of integration. Thereby, greater recharge currents are required, particularly for changes from a high potential to a low potential ("low" level), in order to obtain steep pulse edges at the emitter follower which are required for a short access time to the memory component.

The smaller the degree of integration, the less this effect becomes noticeable. The capacitor charge is small and, simultaneously, the admissible power consumption is not so critical, i.e. in the case of a fixed loss of the memory component, the admissible loss per bit is higher in the case of a low degree of integration. With an increasing degree of integration, the bit capacitances increase and require greater recharging currents. Simultaneously, however, the demands to the boundaries of the loss per bit in the memory component become greater as a whole, so that two mutually opposite demands are given.

Emitter followers and their properties, for example their behavior when subjected to a capacitive load, have been known for quite some time. For example, one may refer to "Proceedings of the IRE 1958", Page 1240 et seq, and to information contained in Speiser "Impulse Circuits", 1963, Page 88 et seq, based on the former article. In addition to explaining the causes for nonsymmetry in the speed of the two pulse edges when switching from a "low" level to a "high" level, or in the opposite direction, respectively, an emitter follower is suggested which utilizes a combination of two transistors of different conductivity types, as a remedy. Both transistors are jointly controlled via a parallel connection of their base inputs. The two emitters are jointly connected at the output of the switch. This circuit construction remains satisfactory in the practice of the present invention. Even if the signal levels required by such a construction are considered, they cannot be applied generally with different circuit techniques since it requires too great a voltage rise. On the other hand, its effectiveness is due to the fact that complementary transistors with approximately equal static and dynamic characteristic curves are used. Such transistors, however, are difficult to realize in integrated circuits with the narrow tolerance requirements made thereon.

SUMMARY OF THE INVENTION

The primary object of the invention, therefore, is to provide a bipolar semiconductor memory of the type mentioned above wherein the prior negative properties of the emitter follower and the pulse behavior in the case of the capacitive load is eliminated by techniques which permit rapid recharging of the capacitive loads, but in a current sparing manner in the case of transistors of one and the same conductivity types. Thereby, it is then possible to produce such bipolar semiconductor memories with a higher degree of integration than in the past and with a reasonable access time, while at the same time obtaining lower losses.

The foregoing object is achieved by proceeding from the fact that selected emitter followers have sufficient emitter current at any time and thus remain in a low resistance condition at the output. In spite of the capacitive load at the output, the condition may not occur wherein, if a rapid change from high to low potential is effected at the base of an emitter follower, the entire word line current available at the output is used for recharging the capacitive load, and thus this output appears current free and the emitter follower becomes highly resistive, i.e. the pulse edge at the emitter does not follow the controlling edge at the base. In other words, the circuit arrangement must be designed in such a way that a minimum current flows at the output of the emitter follower in each phase of the negative pulse edge, so that the base-emitter path of the emitter follower remains in a low resistance condition and the control pulse at the base very quickly forms an image thereof at the emitter.

For the boundary case where this minimum current is equal to zero, the time duration for the recharging process is proportional to the quotient of the capacitance and the recharging current. It would therefore be most simple to sufficiently increase the recharging current. In the case of integrated circuit arrangements with packing densities required nowadays, however, such possibilities are limited since the loss occurring as a result thereof becomes too great.

A solution of this problem, in accordance with the invention, therefore resides in the provision of an additional recharging circuit connected to the memory matrix wherein each word line of the memory matrix is connected in a parallel manner to a common constant current generator, via a respective coupling element, and is embodied in such a way that only one of the selected emitter followers has its output conductively connected with the constant current generator.

In the case of the change of the switching stage of the selected emitter follower, the current of the constant current generator of the recharging circuit will additionally be available at its output, for recharging the capacitive load. Since this constant current source is provided only once, in common, for a multitude of emitter followers, the structure provides a greater current saving them all structures heretofore known, i.e. decentralized embodiments, and can therefore be dimensioned for sufficiently high current, in spite of a desired lower loss of the memory component. It is therefore possible to solve the foregoing problem in a simple manner by way of a technique which falls within the framework of the production of integrated components. Therefore, the steep pulse edges in connection with a low loss can be obtained with the help of emitter followers, which characteristics are desired for the control of a multitude of memory positions, i.e. short access time can be realized even in the case of memory components of a larger capacitance.

BRIEF DESCRIPTION OF THE DRAWINGS

Other objects, features and advantages of the invention, its organization, construction and operation will be best understood from the following detailed description of preferred embodiments thereof taken in conjunction with the accompanying drawings, on which.

DESCRIPTION OF THE PREFERRED EMBODIMENT

Figure 1:
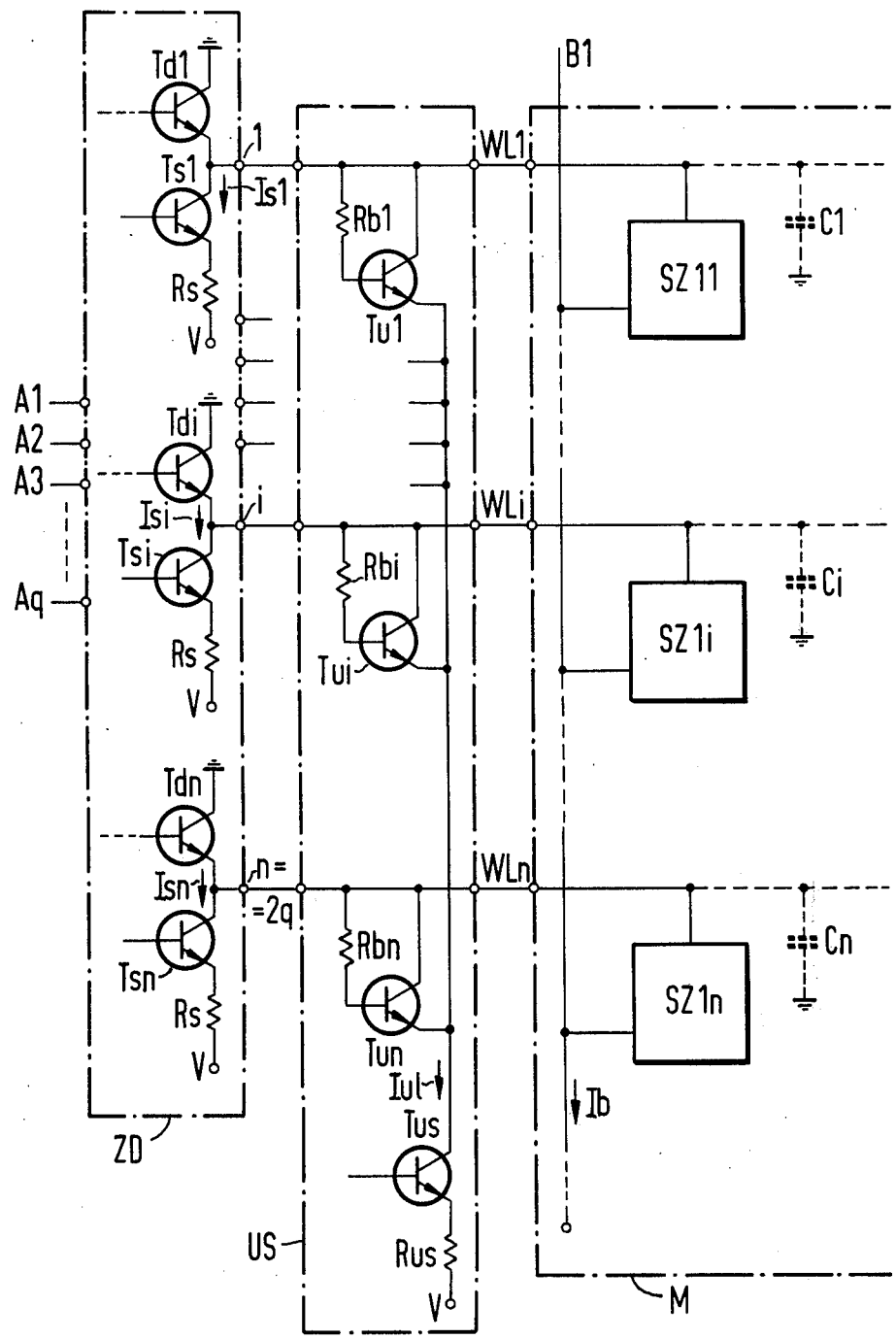
FIG. 1 is a schematic illustration of a portion of a memory system showing a recharging circuit constructed in accordance with the invention and arranged between a line decoder and the memory matrix.

Since bipolar memory components may be assumed to be prior art in general, it is not necessary to go into detail in explaining the construction and function of their essential portions; therefore, only a limited discussion occurs hereinbelow as is thought necessary to explain the invention. Representation in FIG. 1 of the drawing is thus limited to a section of a memory system in order to simultaneously better represent the essence of the invention.

FIG. 1 illustrates the details of an additional recharging circuit US which is arranged between a word line decoder ZD and a memory matrix M. The two common parts of a memory component are illustrated in detail only insofar as is required for an understanding of the invention. Therefore, only output switches embodied as emitter followers $Tdl$–$Tdi$–$Tdn$ have been illustrated in the decoder ZD which have their emitter outputs connected to respective ones of the $n$ word lines $WLl$–$WLi$–$WLn$ in the word line direction. It is not shown in the decoder ZD how a "1-out-of $n$" selective signal is derived from $q$ address signals $Al$–$Aq$ which serve for triggering the base of a selected emitter follower, inasmuch as such structure is well known in the art. In the drawing it is therefore only indicated that a certain one of the $n$ word lines is fixed clearly by $q$ address signals, whereby the relation $n = 2^q$ is to prevail. Inasmuch as a number of identical pluralities of components are associated with each word line, those associated with the line $WLi$ are particularly referred to therein, the operation being the same for the remaining components.

In addition to a word line $WLi$, a respective constant current source is connected to the emitter of the emitter follower $TDi$, which as stated here and in accordance with the prior art, is respectively formed of a further transistor $Tsi$ and an emitter resistor $Rs$ which is connected to an operating voltage V.

On the right hand side of FIG. 1 a section of a memory matrix M has been illustrated. Corresponding to the $n$ outputs of the word line decoder ZD, this matrix has $n$ word lines $WLl$–$WLi$–$WLn$. In the section shown, only the first column of the memory matrix has been illustrated as having a column or bit line B1 and a first, $i^{th}$, and $n^{th}$ memory cell $SZll$, $SZli$ and $SZln$. The memory cells may be adapted to the application of the memory in one of the prior art forms and are furthermore connected to a respective word line.

Purely schematically, it is illustrated in FIG. 1 that the bit line B1 carries a bit line current $Ib$ which is produced by a current source (not shown) connected to the bit line. In order to indicate that the memory cells connected at the word line represent a load having a capacitive component, a respective capacitance $Cl$–$Ci$–$Cn$ has been schematically illustrated by broken lines as being connected to the respective word lines.

The additional recharging circuit US arranged between the word line decoder ZD and the memory matrix M includes a coupling element associated with each word line $WLi$ which is formed by one of the recharging transistors $Tui$. The base and collector of the transistor $Tui$ are connected to the associated word line $WLi$. In this exemplary embodiment of the invention, a base resistor $Rbi$ of the recharging transistor $Tui$ is also illustrated as connecting the base of the transistor to the word line. The function of this resistor will be explained later on. The emitters of all recharging transistors are commonly connected to a central constant current source which is formed by a further transistor $Tus$ and its emitter resistor $Rus$. Analogous to the current sources in the word line decoder ZD, the emitter resistor $Rus$ of this constant current source is connected to the operating potential V.

The function of the recharging circuit will be explained in the following with the aid of FIGS. 2 and 3. In the diagrams illustrated in these figures, the relative output level $u[\%]$ at the output of a selected emitter follower has been illustrated as an ordinate and the time $t$ as an abscissa. In the range of the 50% value of the output level, an evaluation range has been shown and referenced UB in which a following circuit, for example a reading amplifier, evaluates a positive or negative change of the switching state at the emitter. The output levels positioned above and below this evaluation range are therefore to be regarded as "high" potentials or "low" potentials, respectively. The end values $u = 0\%$ and $u = 100\%$ which correspond to the switching states LOGIC "0" and LOGIC "1" of the emitter follower, therefore only result in a required interference voltage distance.

In order to illustrate the principle of the invention, the resistance of the base resistor $Rbi$ is to be neglected at first, i.e. it is at first assumed that the recharging transistor $Tui$ has its collector and its base directly connected to the associated word line $WLi$. The constant current generator $Tus$, $Rus$ in the recharging circuit US supplies a constant current $Iul$. The output of the word line decoder ZD drives the current $Isi$ as a preload current. If it is furthermore assumed that the first word line $WLl$ is selected, the emitter of the emitter follower $Tdl$ is at a high potential where $u = 100\%$. This corresponds to the state LOGIC "1". The transistor additionally obtains the current $Iul$ of the recharging circuit US since the recharging transistor $Tul$ has a higher base potential than all other recharging transistors. If the selection of this emitter follower $Tdl$ is changed, for example to the $n^{th}$ emitter follower $Tdn$, the capacitance C1 associated with the first word line $WLl$ must be recharged from a high potential to a low potential.

Figure 3:
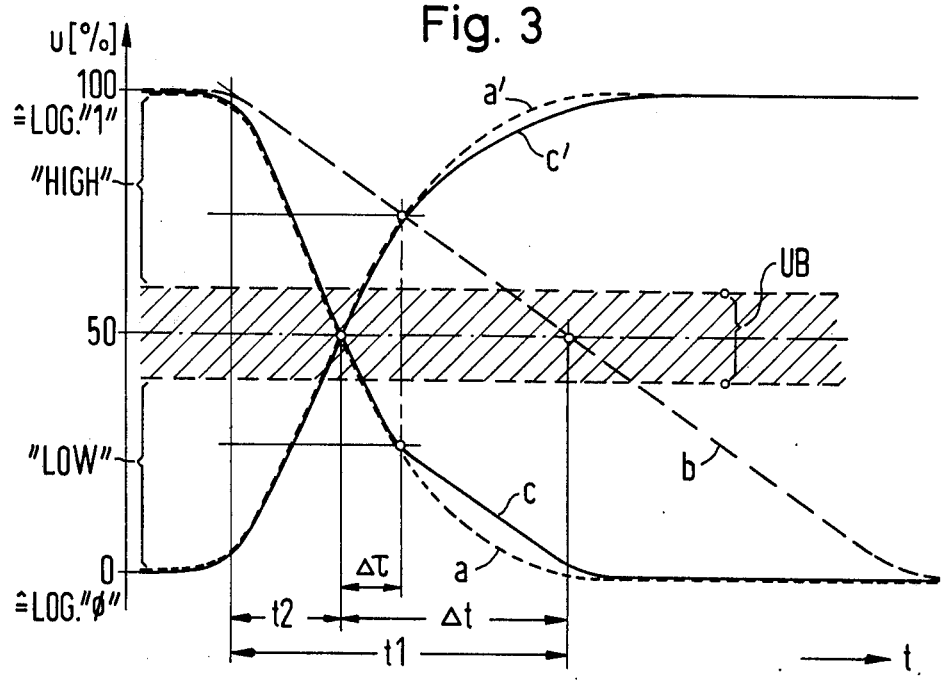
FIG. 3 is a further pulse diagram for explaining the function of the improved embodiment of the recharging circuit illustrated in FIG. 1.

In FIG. 3, the control pulse edge at the base of a selected emitter follower $Tdl$ has been referenced $a$, which is lowered by the amount of its base-emitter voltage UBE. The reference $b$ is applied to the pulse at the emitter of the emitter follower which would be expected if the capacitance C1 would be recharged only by way of the preload current $Isl$ of the selected output of the word line decoder ZD without an additional recharging circuit. The time from the beginning of the control pulse edge $a$ up to the decrease of the output pulse edge at the emitter to the 50% value, is denoted as the time $tl$. This time duration represents the entire time delay which is caused in this case by the recharging process and which has an effect on the following circuits.

However, the recharging circuit US makes the additional current $Iul$ available. The entire current for recharging a capacitance is therefore, a maximum, equal to the sum of the preload current $Isi$ and the additional recharging current $Iul$. This additional current accelerates the recharging of the capacitance C1 and steepens the output pulse edge at the emitter of the emitter follower, as is shown by the reference c. At the 50% value of the output level u, however, the two emitter followers T$dl$ and T$dn$, which participate in the change of the selection, have an equal output potential. The potential at the newly selected emitter following T$dn$ now decreases further; therefore, the latter will regularly take over the recharging current l$ul$, via the recharging transistor T$un$ which therefore is not effective any longer for further recharging of the capacitance C1. This entails that the curve referenced c in FIG. 2 includes a bend at the time $t2$ and then extends linearly as the curve b.

Figure 2:
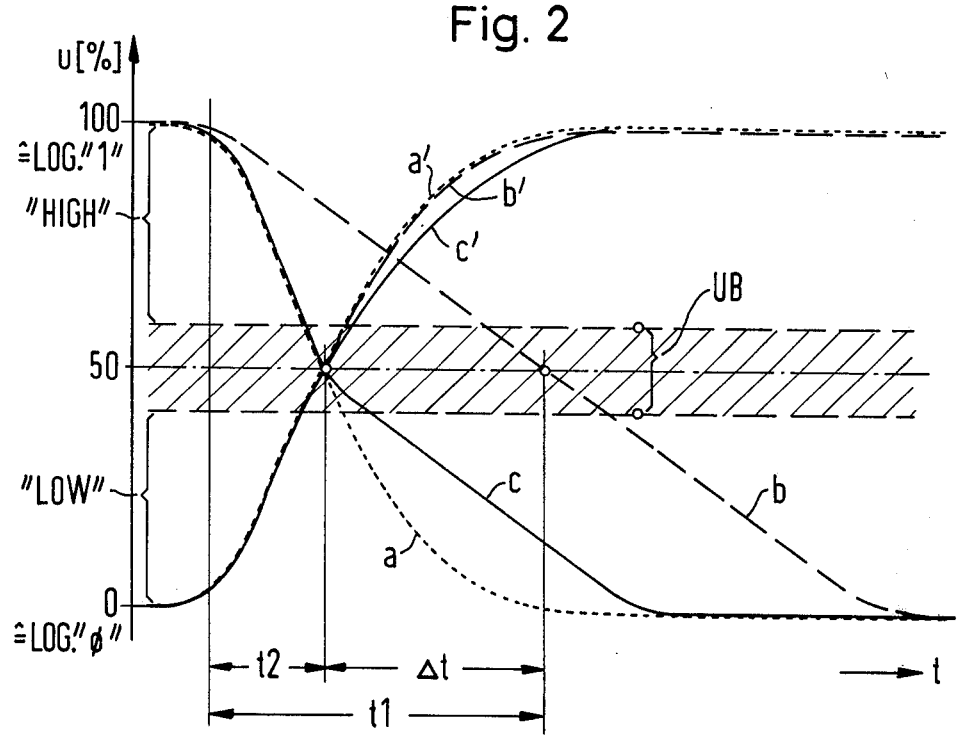
FIG. 2 is a pulse diagram to aid in explaining the principle of pulse behavior of an emitter follower at the output of the decoder wherein the decoder is associated with a recharging circuit.

The reverse of this process, i.e. a change of an emitter follower from a low potential to a high potential, is similar and is illustrated in FIG. 2 by the respectively denoted curves $a'$, $b'$ and $c'$. In the example discussed herein, the $n^{th}$ emitter follower T$dn$ will therefore extend up to the 50% value of the output level in the evaluation range UB without having to drive the recharging current l$ul$. The selected emitter follower can therefore apply all of its current reserve for charging the capacitance C$n$ to the high level. As can be seen from the curves referenced with primes, this process would continue even beyond the instant of time $t2$ where the switching pulse edges $b'$ reach the 50% value of the output level $u$, without a recharging circuit US. In the case of such a switching state, however, as has been mentioned above, the selected emitter follower T$dn$ would take over the recharging current l$ul$ from this instant of time and, due to its finite internal resistance, a bend can form again in the positive edge, as is illustrated by the difference between the two switching pulse edges $b'$ and $c'$.

FIG. 2 now reveals that it is possible with the help of the recharging circuit US to lower the switching delay and the emitter follower, in particular when reloading from a high potential to a low potential, at a time duration denoted by the reference $\Delta t$. In this embodiment, however, it should be objected that such a dimensioning of the recharging circuit US causes the bending point of the switching pulse edges denoted by $c$ or $c'$, respectively, to be positioned in the evaluation range UB. A greater safety in the evaluation of the output signals is obtained when these bending points are positioned beyond this evaluation range in the direction toward the ends of the pulse edges. This is obtained with the help of the recharging circuit US illustrated in FIG. 1 by way of the base resistor R$bi$ of the recharged transistor T$ui$. These resistors (there is one in each recharging circuit) form time constants at the base connections with the capacitances which are effective at that point and which slow down the recharging of the recharging transistors. Therefore, the current reception charge delivers itself in the case of a level change beyond the evaluation range UB, in the direction toward the ends of the pulse edges. This is illustrated in FIG. 3, wherein, in comparison to FIG. 2, similar switching edges are denoted by similar reference characters. The differences in FIGS. 2 and 3 are generally due to the firstly assumed similification that the recharging transistors have their bases directly connected to the associated word lines. The base resistances are therefore the cause for the shift of the bending points of the output pulse edges $c$ or $c'$, respectively, over a range referenced as $\Delta \tau$ in the direction toward the ends of the pulses.

The above described exemplary embodiments of the invention illustrate that the required time duration until the control pulse edge at the base of an emitter follower becomes effective at its emitter can be essentially shortened by the utilization of such a recharging circuit. For this purpose it is not essential in principle whether recharge transistors or only coupled diodes are employed, in order to advantageously couple the common current source of the recharging circuit to the individual word lines, as described in the exemplary embodiments. For reasons of the most simple production in the case of integrated components, however, the first case is generally preferred. Furthermore, it does not represent a limitation of the invention that the recharging switch direction in the case of the described exemplary embodiment is arranged between the word line decoder and the memory matrix. The essential advantage of shortening the access time to the memory component to approximately ⅓ of the access time required without a recharging circuit can also be obtained with a different spatial arrangement. The representation in FIG. 1 therefore does not at all determine the certain resolution of the circuit, as this is common with integrated circuits.

Although I have described my invention by reference to a particular illustrative embodiment thereof, many changes and modifications of the invention may become apparent to those skilled in the art without departing from the spirit and scope of the invention. Therefore, I intend to include within the patent warranted hereon all such changes and modifications as may reasonably and properly be included within the scope of my contribution to the art.

I claim:

1. A bipolar semiconductor memory system comprising:
   a word organized memory including a plurality of memory cells arranged in a matrix of columns and rows, a plurality of bit lines each connected to each memory cell of a respective column, and a plurality of word lines each connected to each memory cell of a respective row, said memory cells constituting a capacitive load connected to said lines;
   a decoder for receiving address signals for selecting memory words, said decoder including a plurality of emitter follower output switches each connected to a respective word line; and
   a recharging circuit connected to each word line of said memory, said recharging circuit including a common constant current generator for said word lines, and a plurality of coupling circuits each connecting a respective word line to said constant current generator, each of said coupling circuits comprising a diode structure connected between a respective word line and said common constant current generator.

2. A bipolar semiconductor memory system comprising:
   a word organized memory including a plurality of memory cells arranged in a matrix of columns and rows, a plurality of bit lines each connected to each memory cell of a respective column, and a plurality of word lines each connected to each memory cell of a respective row, said memory cells constituting a capacitive load connected to said lines;
   a decoder for receiving address signals for selecting memory words, said decoder including a plurality of emitter follower output switches each connected to a respective word line; and a recharging circuit connected to each word line of said memory, said recharging circuit including a common constant current generator for said word lines, and a plurality of coupling circuits each connecting a respective word line to said constant current generator, each of said coupling circuits comprising a transistor including a base, an emitter and a collector, said emitter connected to said common constant current generator and said collector connected to the respective word line, and a resistor connecting said base to the respective word line.

* * * * *